(12) United States Patent
Peterson et al.

(10) Patent No.: US 9,536,593 B1
(45) Date of Patent: Jan. 3, 2017

(54) LOW POWER RECEIVER WITH WIDE INPUT VOLTAGE RANGE

(71) Applicant: QUALCOMM Incorporated, San Diego, CA (US)

(72) Inventors: LuVerne Ray Peterson, San Diego, CA (US); Thomas Bryan, Carlsbad, CA (US); Jacob Schneider, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/162,430

(22) Filed: May 23, 2016

(51) Int. Cl.
| G11C 11/4093 | (2006.01) |
| *H03F 3/50* | (2006.01) |
| G11C 7/10 | (2006.01) |
| H03K 19/003 | (2006.01) |

(52) U.S. Cl.
CPC ........... *G11C 11/4093* (2013.01); *H03F 3/505* (2013.01); *G11C 7/1078* (2013.01); *G11C 7/1084* (2013.01); *H03F 2200/69* (2013.01); *H03K 19/00315* (2013.01)

(58) Field of Classification Search
CPC . G11C 7/1078; G11C 7/1084; G11C 11/4093; H03F 3/505; H03F 2200/69; H03K 19/00315
See application file for complete search history.

(56) References Cited

U.S. PATENT DOCUMENTS

| 5,280,201 | A | * | 1/1994 | Fujimori | .......... | H03K 3/356165 |
| | | | | | | 326/112 |
| 5,378,945 | A | * | 1/1995 | Partovi | .......... | H03K 19/018521 |
| | | | | | | 326/121 |
| 5,400,295 | A | * | 3/1995 | Matsumura | .......... | G11C 7/1051 |
| | | | | | | 326/121 |
| 5,831,452 | A | * | 11/1998 | Nowak | .............. | H03K 19/0963 |
| | | | | | | 326/121 |
| 5,905,621 | A | * | 5/1999 | Drapkin | ........... | H03K 19/00315 |
| | | | | | | 361/111 |
| 6,342,996 | B1 | * | 1/2002 | Drapkin | ......... | H03K 19/018521 |
| | | | | | | 326/81 |
| 6,882,209 | B1 | | 4/2005 | Isbara | | |
| 7,504,861 | B2 | * | 3/2009 | Chuang | .............. | H03K 19/0013 |
| | | | | | | 326/68 |
| 7,521,970 | B2 | | 4/2009 | Gupta et al. | | |
| 7,554,361 | B2 | * | 6/2009 | Kim | ................. | H03K 17/08122 |
| | | | | | | 326/68 |
| 8,330,491 | B2 | | 12/2012 | Nedalgi | | |
| 2012/0161813 | A1 | | 6/2012 | Cho et al. | | |
| 2015/0042401 | A1 | | 2/2015 | Knol et al. | | |

* cited by examiner

*Primary Examiner* — Harry W Byrne
*Assistant Examiner* — R Lance Reidlinger
(74) *Attorney, Agent, or Firm* — Haynes and Boone, LLP

(57) ABSTRACT

An input receiver is provided with a pass transistor that is controlled to pass an input signal to an inverter only while a first binary state for the input signal equals a low voltage. The input receiver also includes a source follower transistor configured to pass a threshold-voltage-reduced version of the input signal while the first binary state of the input signal equals a high voltage greater than the low voltage.

22 Claims, 3 Drawing Sheets

US 9,536,593 B1

LOW POWER RECEIVER WITH WIDE INPUT VOLTAGE RANGE

TECHNICAL FIELD

This application relates to a receiver, and more particularly to a receiver with a wide input voltage range.

BACKGROUND

Extending battery life by reducing power consumption in mobile devices is a challenging task as the processing power for their integrated circuits such as a system-on-a-chip (SOC) continues to increase. To provide reduced power consumption in the dynamic random access memory (DRAM) devices for the mobile market, various low power double data rate (LPDDR) DRAM standards have evolved in which the DRAM may vary the signaling voltage used to transmit data to the receiving SOC. In a low voltage mode, the DRAM uses a lower signaling voltage such as 0.5 V whereas in a high voltage mode the DRAM may use a higher signaling voltage such as 0.9V or 1.1V. In contrast, the receiver power supply voltage (VDDIO) used by the receiver in the SOC to receive the data from the external DRAM is independent of the DRAM signaling voltage but VDDIO may also vary widely such as from 0.5 to 1.1V depending upon the mode of operation within the SOC.

The independent variation between the DRAM signaling voltage and power supply voltage VDDIO in the receiver makes low power operation challenging. For example, it is convenient to receive the data from the DRAM by driving the gates of a serially-stacked PMOS and NMOS transistor pair in an inverter with the received data signal. If the power supply voltage VDDIO is relatively high (e.g., 1.1V) whereas the DRAM signaling voltage is relatively low, the PMOS transistor in the receiver's inverter will still be weakly on despite receiving a binary high signal because the received 0.5 volt signal acts as a weak zero to the PMOS since its source is tied to the 1.1 volt power supply voltage. The inverter will thus undesirably conduct current since the PMOS transistor is not fully off. Moreover, it is a challenge to construct a receiver that is tolerant to the higher voltage ranges for the input signal yet regains enough input amplification to work with the lower input voltage swings.

Accordingly, there is a need in the art for improved low power receivers with wide input voltage ranges.

SUMMARY

A low power receiver is provided for the receipt of an input signal having a relatively wide range of voltages for representing a first binary state (e.g., a logic one value or a logic zero value depending upon the logic convention in a given implementation). The input signal has a low voltage mode of operation in which the first binary state is represented by low voltage that is less than a high voltage for the first binary state during a high voltage mode of operation. The high voltage may be twice as high or higher than the low voltage. To accommodate such a wide voltage range for the input signal, the receiver includes a pass transistor controlled by a control circuit to pass the input signal to an input of an inverter during the low voltage mode of operation. During the high voltage mode of operation, the control circuit blocks the pass transistor from passing the high voltage input signal to the input of the inverter.

A source follower transistor functions to pass a threshold-voltage-reduced version of the input signal to the input of the inverter during the high voltage mode of operation. The threshold-voltage-reduced-version of the input signal is reduced by a threshold voltage for the source follower transistor. The inverter is thus never exposed to the high voltage for the input signal such that the inverter may be constructed from thin-oxide devices to facilitate high-speed operation for the input receiver.

These and additional advantages may be better appreciated through the following detailed description.

BRIEF DESCRIPTION OF THE DRAWINGS

Embodiments of the disclosure and their advantages are best understood by referring to the detailed description that follows. It should be appreciated that like reference numerals are used to identify like elements illustrated in one or more of the figures.

DETAILED DESCRIPTION

A low power receiver is provided that accommodates the receipt of a data signal that has a wide range of possible binary high voltages. For example, in one embodiment, a first binary state for the input signal (e.g., its binary high value) may range from 0.5 V to 0.9V. The following discussion will assume that the first binary state is a binary high (logic one) state but it will be appreciated that a positive voltage for the input signal may represent a logic zero value in alternative implementations. The binary high voltage (the voltage state representing a binary one) for the input signal is denoted herein as voltage input high (VIH), which may have a range of 2:1 (or more) from its lowest value in a low voltage signaling mode as compared to its highest value in a high voltage signaling mode. For example, a DRAM device may present such a wide VIH input voltage range when operating according to a low power double data rate (LPDDR) standard but it will be appreciated that the receiver disclosed herein is not limited to the receiving of an LPDDR input signal.

Given this wide input signal voltage range, one approach has been to receive such input signals using an inverter constructed of thick-oxide transistors. But the resulting input receiver has difficulty achieving a high speed of operation. Moreover, the PMOS transistor in the inverter in such conventional receivers (regardless of the oxide thickness) will tend to needlessly discharge current during a low voltage mode operation for the input signal (this mode of operation will be referred to herein as the low VIH mode for brevity). It is preferable to instead construct the inverter using thin-oxide transistors for high-speed operation but the resulting inverter may then be stressed by the high voltage mode of operation for the input signal (this mode of operation will be referred to herein as the high VIH mode for brevity). To prevent this stress, the disclosed receiver includes a pass transistor for passing the input signal to the inverter during the low VIH mode. A control circuit controls the gate of the pass transistor to control whether the pass transistor passes or blocks the input high signal. In particular, the control circuit maintains the pass transistor on while VIH is in the low VIH mode. Thus, during the low VIH mode in which VIH equals a low voltage, the pass transistor passes the input signal to the inverter. If the input signal switches to the high VIH mode in which VIH equals a high voltage, the control circuit switches the pass transistor off. The pass transistor functions to pass the input signal in both the low VIH mode and in the high VIH mode when the input signal is a binary zero (ground).

Figure 1:
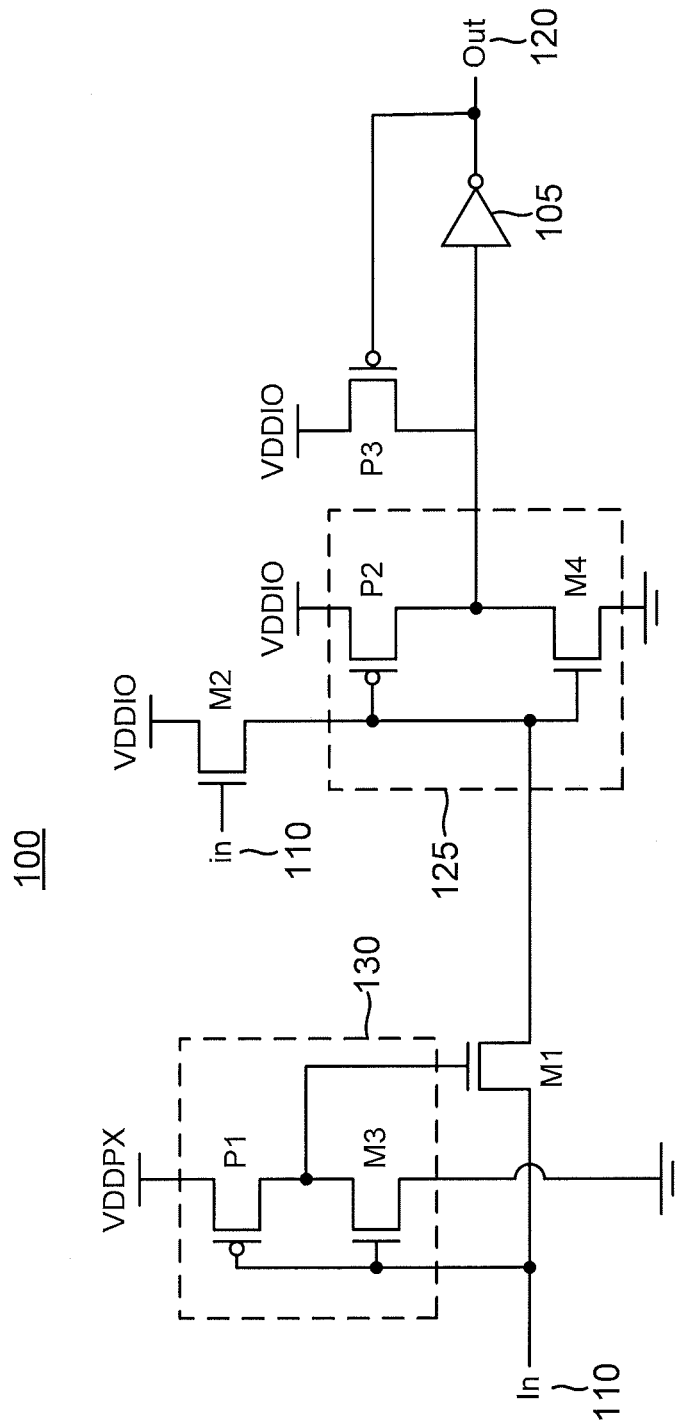
FIG. 1 is a circuit diagram of an example input receiver.

During the high VIH mode in which VIH equals the high voltage, the input signal instead drives the input of the inverter through the source of a source follower transistor. The source follower transistor introduces a threshold drop in its source voltage such that the thin-oxide devices in the inverter are not stressed despite the receipt of the high voltage input signal. The resulting receiver thus maintains the advantage of high-speed operation for its inverter without any voltage stress from the high VIH mode. An example input receiver 100 is shown in FIG. 1. An inverter 125 includes a thin-oxide PMOS transistor P2 having its source tied to a power supply node for a receiver power supply voltage VDDIO that is independent of VIH for an input signal 110. Inverter 125 also includes a thin-oxide NMOS transistor M4 having its drain coupled to a drain for transistor P2. These drains form an output node for inverter 125. The gates for transistors P2 and M4 form an input node for inverter 125. The source of transistor M4 couples to ground.

An NMOS pass transistor M1 passes input signal 110 during the low VIH mode as controlled by a control circuit 130. In one implementation, control circuit 130 includes an inverter formed by a PMOS transistor P1 having its source coupled to a stable power supply voltage node supplying a stable power supply voltage VDDPX. An example of such a stable power supply voltage VDDPX is used by the LPDDR4 standard, in which case VDDPX is guaranteed to be approximately 1.1V. In an LPDDR embodiment, VDDPX may thus also be denoted as a stable LPDDR power supply voltage. This stable power supply voltage may be provided by, for example, a power management integrated circuit (PMIC) (not illustrated) to both input receiver 100 and to an external DRAM (also not illustrated) driving input signal 110 to receiver 100. In general, VDDPX should be a stable power supply voltage that is as least as high as VIH is during the high VIH mode. The drain of transistor P1 couples to an NMOS transistor M3 having its source coupled to ground. The drains for transistors P1 and M3 are coupled to the gate of the pass transistor M1. During the low VIH mode, transistor P1 is switched on such that the gate of pass transistor M1 is charged to VDDPX. In the low VIH mode, pass transistor M1 passes input signal 110 without any threshold voltage drop to the gates of transistors P2 and M4 in inverter 125. Inverter 125 thus receives input signal 110 through pass transistor M1 during the low VIH mode. Should VIH switch to the high VIH mode, transistor M3 in control circuit 130 switches on to ground the gate of pass transistor M1 to block pass transistor M1 from passing input signal 110 to inverter 125.

A source follower transistor such as an NMOS source follower transistor M2 functions during the high VIH mode to drive inverter 125 with a threshold-voltage-reduced version of input signal 110. In particular, a source of source follower transistor M2 couples to the input of inverter 125 whereas its drain couples to a power supply node supplying the receiver power supply voltage VDDIO. Input signal 110 drives the gate of source follower transistor M2. During the low VIH mode, pass transistor M1 functions to drive the source of source follower transistor M2 with input signal 110 such that the gate-to-source voltage of source follower transistor M2 is essentially zero during the low VIH mode. Source follower transistor M2 is thus shut off during the low VIH mode. But during the high VIH mode, the gate-to-source voltage of source follower transistor M2 exceeds its threshold voltage such that source follower transistor M2 passes a threshold-voltage-reduced version of input signal 110 to the input of inverter 125. In this fashion, the input of inverter 125 is never exposed to a voltage approximately greater than the low VIH value of VIH regardless of whether input signal 110 is driven in the low VIH mode or the high VIH mode. Transistor P2 and M4 in inverter 125 may thus comprise thin-oxide transistors (core devices), which advantageously enhances high-speed operation. Since transistors P1, M3, M1, and M2 are exposed to the high VIH value and/or VDDPX, these transistors may comprise thick-oxide transistors. The gate oxide thickness for such transistors is greater than the gate oxide thickness used in thin-oxide transistors.

A second inverter 105 powered by VDDIO inverts the output from inverter 125 to produce an output signal 120 for receiver 100. Inverter 125 may thus also be denoted as a first inverter. To assist the pull-up of the output for inverter 125 in either the low or high VIH mode, output signal 120 drives a gate of a half-latch PMOS transistor P3 having its source coupled to the receiver power supply node supplying VDDIO and its drain coupled to the output of inverter 125 (and hence to the input of second inverter 105). As output signal 120 discharges towards ground, half-latch transistor P3 is thus switched on to charge the input of second inverter 125 towards VDDIO, which further reinforces the discharge of output signal 120.

In one embodiment, pass transistor M1 and control circuit 130 may be deemed to comprise a means for passing input signal 110 to an input of the inverter 125 responsive to a binary high value of input signal 110 equaling a low voltage and for blocking input signal 110 from passing to the input of the inverter 125 responsive to the binary high value of input signal 110 equaling a high voltage, wherein the high voltage is greater than the low voltage.

Figure 2:
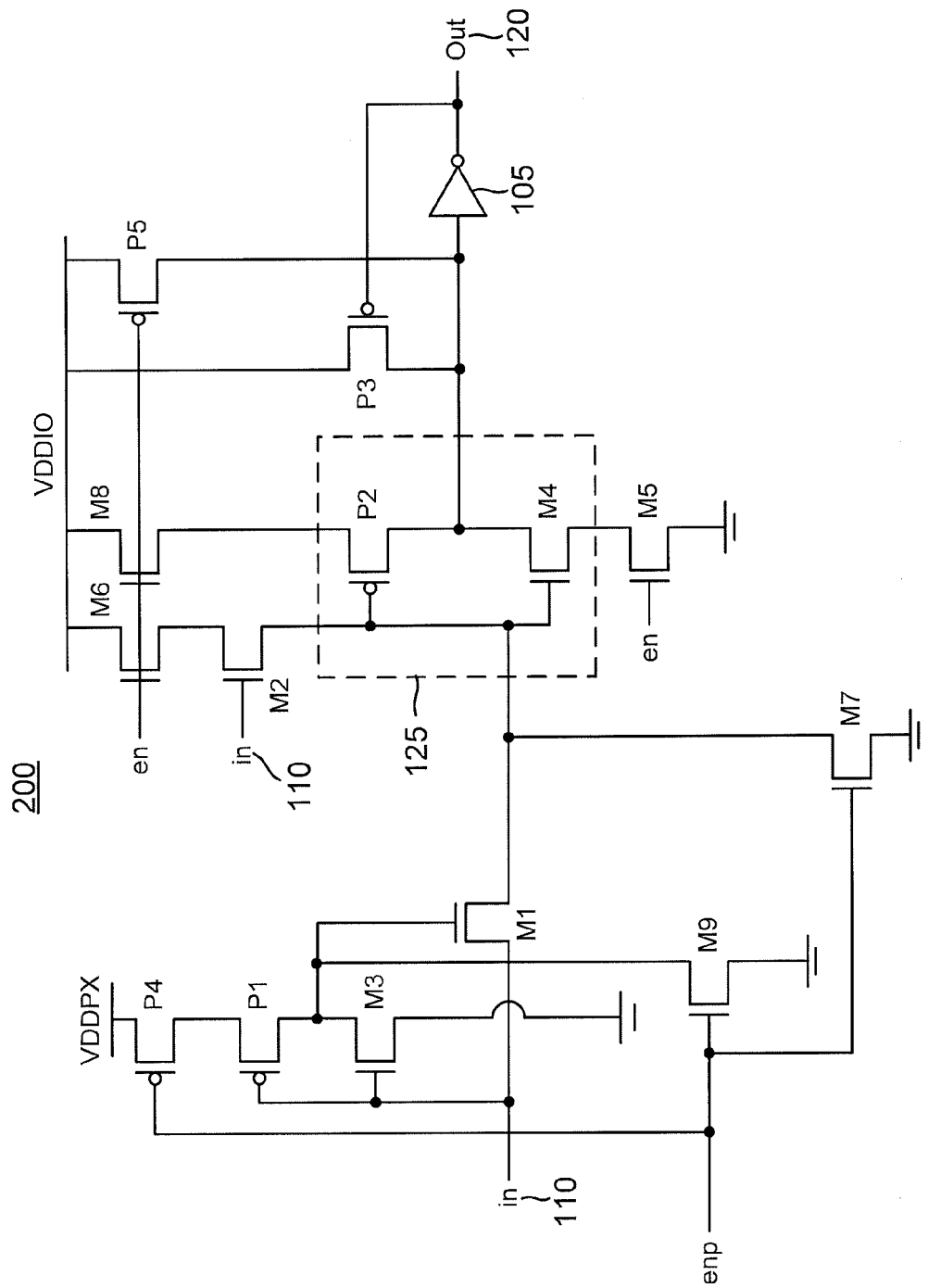
FIG. 2 is a circuit diagram of a modified version of the input receiver of FIG. 1.

If the receiver power supply voltage VDDIO does not substantially exceed the low value for VIH, transistor P2 will be firmly off when the input signal 110 is charged to VIH in the low VIH mode. But note that is conventional for a device such as an SOC including receiver 100 to have multiple operating modes in which the supply voltage is varied to save power. In particular, the receiver power supply voltage VDDIO may be roughly equal to the low value for VIH during a low power mode for receiver 100 whereas it may instead be roughly equal to the high value for VIH during a high power mode for receiver 100. These modes of operation for receiver 100 are independent of whether the external source such as a DRAM drives input signal 110 according to the low VIH mode or the high VIH mode. It thus may be the case that receiver 100 is operating in a high power mode in which the receiver power supply voltage VDDIO is substantially greater than VIH during the VIH low mode. To prevent undesirable current discharge through PMOS transistor P2 when VIH is in the binary high state in such a combination of modes, receiver 100 may be modified as shown for a receiver 200 in FIG. 2.

In particular, the source of PMOS transistor P2 in receiver 200 couples to the VDDIO power supply node through an NMOS transistor M8 having its gate driven by a VDDPX-level enable signal en. The enable signal en is driven high to VDDPX while receiver 200 operates in either the high power or low power modes. Thus, should receiver 200 be operating in the high power mode, transistor M8 will drop this high value for VDDIO by its threshold voltage to drive the source of transistor P2 with this reduced power supply voltage. In an embodiment in which the high power mode value for VDDIO is approximately 1.1 V and the low value for VIH in the low VIH mode is 0.5 V, the source of transistor P2 in inverter 125 will thus be charged to approximately the low value of VIH due to the threshold drop across transistor M8. VIH in the low VIH mode will thus be a strong one to the gate of transistor P2 such that transistor P2 is fully off and not conducting current during the low VIH mode. Similarly, VIH in the high VIH mode will also be reduced by source follower transistor M2 such that transistor P2 is also fully off during the high VIH mode.

To ensure that the devices in receiver 200 are in known states during a reset or inactive period for receiver 200 in which the enable signal en is grounded, the drain of source follower transistor M2 may couple to the VDDIO power supply node through an NMOS transistor M6 having its gate also driven by the enable signal en. Thus when the enable signal en is grounded, source follower transistor M2 is safely isolated from the receiver power supply node. Similarly, the enable signal also drives the gate of a PMOS transistor P5 having its source tied to the receiver power supply node and its drain coupled to the input of second inverter 105. Thus, when the enable signal en is discharged during an inactive period for receiver 200, output signal 120 will always be discharged.

A complement of the enable signal en (enp) is charged to VDDPX during the inactive period and discharged while the enable signal en is charged to VDDPX. The complement enable signal enp drives a gate of an NMOS transistor M9 having its source coupled to ground and its drain coupled to the gate of pass transistor M1. The pass transistor M1 will thus be switched off during the inactive period due to its gate being discharged through transistor M9. Similarly, another NMOS transistor M7 has its gate driven by the complement enable signal enp. The source of transistor M7 couples to ground and its drain coupled to the input to inverter 125. Thus, the input to inverter 125 is discharged through transistor M7 during the inactive period. In addition, the complement enable signal enb drives a gate of a PMOS transistor P4 having its source coupled to the VDDPX power supply node and its drain coupled to the source of transistor P1. Transistor P1 will thus be isolated from the VDDPX power supply voltage during the inactive period.

To assist that a duty factor of output signal 120 achieves a desired 50/50 duty cycle when consecutive binary ones and zeroes are driven through receiver 200, the source of transistor M4 couples to ground through an NMOS transistor M5 having its source coupled to ground. Transistor M5 acts to provide a relatively small amount of resistance such that transistor M4 cannot discharge the input to inverter 105 as strongly as it would if instead the source of transistor M4 coupled directly to ground. This resistance improves the duty cycle of output signal 120. The enable signal en drives the gate of transistor M4 so that it is active during normal operation.

Figure 3:
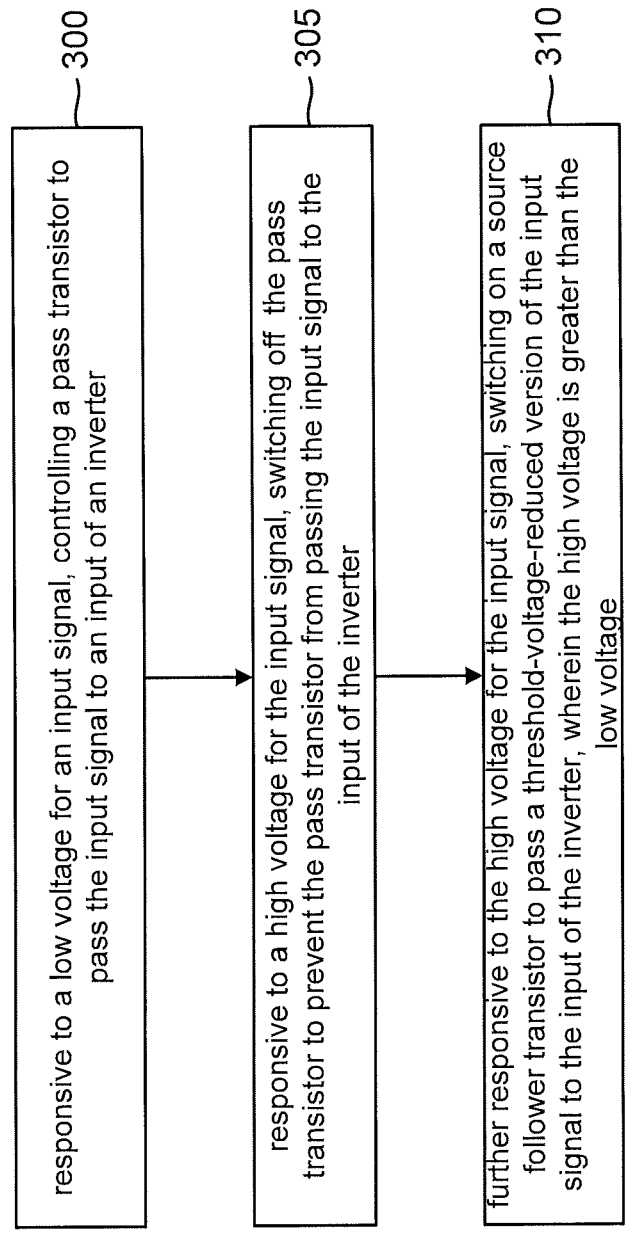
FIG. 3 is a flowchart for a method of operation for the input receiver of FIG. 1.

A method of operation of receiver 100 will now be discussed with regard to the flowchart of FIG. 3, The method begins with act 300 of, responsive to a low voltage for an input signal, controlling a pass transistor to pass the input signal to an input of an inverter. The passing of input signal 120 through pass transistor M1 during the low VIH mode of operation as discussed with regard to receiver 100 of FIG. 1 is an example of act 300.

The method also includes an act 305 of, responsive to a high voltage for the input signal, switching off the pass transistor to prevent the pass transistor from passing the input signal to the input of the inverter. The switching off of pass transistor M1 during the high VIH mode of operation as discussed with regard to receiver 100 of FIG. 1 is an example of act 305.

Finally, the method includes an act 310 of further responsive to the high voltage for the input signal, switching on a source follower transistor to pass a threshold-voltage-reduced version of the input signal to the input of the inverter, wherein the high voltage is greater than the low voltage. The passing of a threshold-voltage-reduced version of the input signal by source follower transistor M2 as discussed with regard to receiver 100 of FIG. 1 is an example of act 310.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. An input receiver, comprising:
   a pass transistor;
   a first inverter;
   a control circuit configured to switch on the pass transistor to pass an input signal through the pass transistor to an input of the first inverter responsive to a receipt of the input signal equaling a low voltage in a first binary state, wherein the control circuit is further configured to switch off the pass transistor responsive to a receipt of the input signal equaling a high voltage in the first binary state; wherein the high voltage is greater than the low voltage; and
   a source follower transistor configured to pass a threshold-voltage-reduced version of the input signal to the input of the inverter responsive to the receipt of the input signal equaling the high voltage in the first binary state.

2. The input receiver of claim 1, wherein the first inverter comprises thin-oxide transistors and wherein the control circuit comprises thick-oxide transistors and the pass transistor comprises a thick-oxide transistor.

3. The input receiver of claim 1, wherein the first inverter is configured to be powered by a receiver power supply voltage having a low voltage mode of operation and a high voltage mode of operation, and wherein the control circuit comprises an inverter including a PMOS transistor having a source coupled to a power supply node supplying a stable power supply voltage.

4. The input receiver of claim 1, further comprising a second inverter having an input coupled to an output of the first inverter.

5. The input receiver of claim 4, further comprising: a PMOS transistor having a source coupled to a receiver power supply voltage node and a drain coupled to the input of the second inverter, wherein an output of the second inverter is coupled to a gate of the PMOS transistor.

6. The input receiver of claim 1, wherein the input signal comprises an output signal from a low power double data rate (LPDDR) dynamic random access memory (DRAM), and wherein the control circuit comprises a first PMOS transistor having a source coupled to a power supply node configured to supply a LPDDR stable power supply voltage and comprises a first NMOS transistor having a source coupled to ground and a drain coupled to a drain of the first PMOS transistor, and wherein the input signal is coupled to a gate for the first PMOS transistor and to a gate for the first NMOS transistor, wherein the drain for the first PMOS transistor is coupled to a gate of the pass transistor, and wherein the first binary state is a binary high state.

7. The input receiver of claim 6, wherein the pass transistor is a second NMOS transistor.

8. The input receiver of claim 6, wherein the source follower transistor is a second NMOS transistor having a drain coupled to a node configured to supply a receiver power supply voltage having a low voltage mode of operation and a high voltage mode of operation.

9. The input receiver of claim 8, wherein the first inverter is configured to be powered by the receiver power supply voltage.

10. The input receiver of claim 8, wherein the first inverter couples to a power supply node configured to supply the receiver power supply voltage through a third NMOS transistor having its gate charged to the LPDDR stable power supply voltage.

11. The input receiver of claim 8, wherein the first inverter couples to ground through a third NMOS transistor having its gate charged to the LPDDR stable power supply voltage.

12. A method of coupling an input signal to a first inverter, comprising:
responsive to a low voltage mode for a first binary state of the input signal, controlling a pass transistor to pass the input signal to an input of the first inverter;
responsive to a high voltage mode for the first binary state of the input signal, switching off the pass transistor to prevent the pass transistor from passing the input signal to the input of the first inverter; and
further responsive to the high voltage mode for the first binary state of the input signal, switching on a source follower transistor to pass a threshold-voltage-reduced version of the input signal to the input of the first inverter, wherein the first binary state for the input signal during the high voltage mode equals a high voltage and wherein the first binary state for the input signal during the low voltage mode equals a low voltage that is less than the high voltage.

13. The method of claim 12, wherein controlling the pass transistor to pass the input signal comprises charging a gate of the pass transistor to a stable low power double data rate (LPDDR) power supply voltage for a dynamic random access memory (DRAM).

14. The method of claim 13, wherein charging the gate of the pass transistor comprises switching on a PMOS transistor responsive to the input signal being charged to the low voltage to couple the gate of the pass transistor to a power supply node supplying the stable LPDDR power supply voltage through the switched-on PMOS transistor.

15. The method of claim 12, wherein switching off the pass transistor comprises switching on an NMOS transistor responsive to the input signal being charged to the high voltage to couple the gate of the pass transistor to ground through the switched-on NMOS transistor.

16. The method of claim 12, further comprising inverting an output of the first inverter through a second inverter.

17. The method of claim 16, further comprising: switching on a transistor to charge the output of the first inverter to a receiver power supply voltage responsive to a discharge of an output of the second inverter.

18. The method of claim 17, further comprising powering the first inverter with the receiver power supply voltage.

19. An input receiver, comprising:
a first inverter;
means for passing an input signal to an input of the first inverter responsive to a binary high value of the input signal equaling a low voltage and for blocking the input signal from passing to the input of the first inverter responsive to the binary high value of the input signal equaling a high voltage, wherein the high voltage is greater than the low voltage; and
a source follower transistor configured to pass a threshold-voltage-reduced version of the input signal to the input of the inverter while the means blocks the input signal from passing to the input of the first inverter.

20. The input receiver of claim 19, wherein the means is powered by a stable low power double data rate (LPDDR) power supply voltage also supplied to an external dynamic random access memory (DRAM), and wherein the first inverter and the source follower transistor are both powered by a receiver power supply voltage.

21. The input receiver of claim 19, further comprising a second inverter configured to invert an output of the first inverter to produce an output signal for the input receiver.

22. The input receiver of claim 19, wherein the first inverter comprises thin-oxide transistors, and wherein the means comprises thick-oxide transistors.

* * * * *